United States Patent
Beach et al.

(10) Patent No.: US 11,930,717 B2
(45) Date of Patent: Mar. 12, 2024

(54) MINIMAL THICKNESS SYNTHETIC ANTIFERROMAGNETIC (SAF) STRUCTURE WITH PERPENDICULAR MAGNETIC ANISOTROPY FOR STT-MRAM

(71) Applicant: Taiwan Semiconductor Manufacturing Company, Ltd., Hsinchu (TW)

(72) Inventors: Robert Beach, Los Gatos, CA (US); Guenole Jan, San Jose, CA (US); Yu-Jen Wang, San Jose, CA (US); Ru-Ying Tong, Los Gatos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 621 days.

(21) Appl. No.: 17/121,523

(22) Filed: Dec. 14, 2020

(65) Prior Publication Data
US 2021/0210674 A1     Jul. 8, 2021

Related U.S. Application Data

(62) Division of application No. 16/258,770, filed on Jan. 28, 2019, now Pat. No. 10,868,235, which is a
(Continued)

(51) Int. Cl.
| | |
|---|---|
| *H10N 50/80* | (2023.01) |
| *G11C 11/16* | (2006.01) |
| *H01F 10/12* | (2006.01) |
| *H01F 10/32* | (2006.01) |
| *H01F 41/30* | (2006.01) |

(Continued)

(52) U.S. Cl.
CPC .......... *H10N 50/80* (2023.02); *G11C 11/161* (2013.01); *H01F 10/123* (2013.01); *H01F 10/3272* (2013.01); *H01F 41/307* (2013.01); *H01L 29/82* (2013.01); *H10B 61/00* (2023.02); *H10B 61/10* (2023.02); *H10N 50/10* (2023.02); *H10N 50/85* (2023.02); *H01F 10/3286* (2013.01)

(58) Field of Classification Search
None
See application file for complete search history.

(56) References Cited

U.S. PATENT DOCUMENTS

| | | | |
|---|---|---|---|
| 7,488,609 B1 * | 2/2009 | Lin ...................... | G11B 5/3906 |
| | | | 257/E21.663 |
| 2007/0086121 A1 | 4/2007 | Nagase et al. | |

(Continued)

*Primary Examiner* — Michelle Mandala
(74) *Attorney, Agent, or Firm* — HAYNES AND BOONE, LLP

(57) ABSTRACT

A synthetic antiferromagnetic structure for a spintronic device is disclosed and has an FL2/Co or Co alloy/antiferromagnetic coupling/Co or Co alloy/CoFeB configuration where FL2 is a ferromagnetic free layer with intrinsic PMA. Antiferromagnetic coupling is improved by inserting a Co or Co alloy dusting layer on top and bottom surfaces of the antiferromagnetic coupling layer. The FL2 layer may be a L10 ordered alloy, a rare earth-transition metal alloy, or an (A1/A2)n laminate where A1 is one of Co, CoFe, or an alloy thereof, and A2 is one of Pt, Pd, Rh, Ru, Ir, Mg, Mo, Os, Si, V, Ni, NiCo, and NiFe, or A1 is Fe and A2 is V. A method is also provided for forming the synthetic antiferromagnetic structure.

20 Claims, 6 Drawing Sheets

Related U.S. Application Data division of application No. 14/489,507, filed on Sep. 18, 2014, now Pat. No. 10,193,056, which is a division of application No. 13/609,780, filed on Sep. 11, 2012, now Pat. No. 8,860,156.

(51) Int. Cl.
  *H01L 29/82* (2006.01)
  *H10B 61/00* (2023.01)
  *H10N 50/10* (2023.01)
  *H10N 50/85* (2023.01)

(56) References Cited

U.S. PATENT DOCUMENTS

| | | |
|---|---|---|
| 2010/0277971 A1 | 11/2010 | Slaughter et al. |
| 2011/0096443 A1 | 4/2011 | Zhang et al. |
| 2012/0241827 A1 | 9/2012 | Daibou et al. |
| 2012/0313191 A1* | 12/2012 | Whig .................... G11C 11/161 |
| | | 257/E29.323 |
| 2013/0154034 A1 | 6/2013 | Apalkov et al. |
| 2013/0154036 A1* | 6/2013 | Tang .................. G11C 11/5607 |
| | | 257/E43.006 |
| 2013/0207209 A1 | 8/2013 | Wang et al. |
| 2014/0306302 A1* | 10/2014 | Jan .......................... H01F 10/30 |
| | | 257/421 |
| 2019/0173003 A1 | 6/2019 | Beach et al. |

* cited by examiner

MINIMAL THICKNESS SYNTHETIC ANTIFERROMAGNETIC (SAF) STRUCTURE WITH PERPENDICULAR MAGNETIC ANISOTROPY FOR STT-MRAM

PRIORITY DATA

The present application is a divisional application of U.S. application Ser. No. 16/258,770, filed Jan. 28, 2019, which is a divisional application of U.S. application Ser. No. 14/489,507, filed on Sep. 18, 2014, which is a divisional application of U.S. application Ser. No. 13/609,780, filed on Sep. 11, 2012, each of which are herein incorporated by reference in their entirety.

RELATED PATENT APPLICATION

This application is related to U.S. Pat. No. 8,064,244, which is herein incorporated by reference in its entirety.

TECHNICAL FIELD

The present disclosure relates to a Magnetoresistive Random Access Memory (MRAM) that includes a magnetic tunnel junction (MTJ) in which a composite reference layer has antiferromagnetic coupling between a layer with intrinsic perpendicular magnetic anisotropy (PMA) and a CoFeB layer to establish PMA in the latter, and composite reference layer thickness is reduced to minimize the stray field (Ho) on the free layer.

BACKGROUND

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale.

Both MRAM and STT-MRAM have a MTJ element based on a tunneling magnetoresistance (TMR) effect wherein a stack of layers has a configuration in which two ferromagnetic layers are separated by a thin non-magnetic dielectric layer, or based on a GMR effect where a reference layer and free layer are separated by a metal spacer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, reference layer, a thin tunnel barrier layer, a ferromagnetic "free" layer, and a capping layer are sequentially formed on a bottom electrode. The reference layer has a fixed magnetization direction. The free layer has a magnetic moment that is either parallel or anti-parallel to the magnetic moment in the reference layer. The tunnel barrier layer is thin enough that a current through it can be established by quantum mechanical tunneling of conduction electrons. When a sense current is passed from the top electrode to the bottom electrode in a direction perpendicular to the MTJ layers, a lower resistance is detected when the magnetization directions of the free and reference layers are in a parallel state ("0" or P memory state) and a higher resistance is noted when they are in an anti-parallel state ("1" or AP memory state). In STT-MRAM, the resistance can be switched between the two states by the application of a current pulse of sufficient magnitude to write the bit to the opposite state.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. Compared with conventional MRAM, spin-transfer torque or STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-MRAM and a conventional MRAM is only in the write operation mechanism. The read mechanism is the same.

Typically, the magnetic moments of the reference layer and free layer are in an in-plane direction. However, for a variety of reasons, it is advantageous to engineer perpendicular magnetic anisotropy (PMA) into the aforementioned layers so that their magnetization direction is perpendicular-to-plane. The source of PMA may be intrinsic or it may be induced in a ferromagnetic layer at interfaces with an oxide layer, for example, in situations where the ferromagnetic layer has a thickness less than a threshold level. A viable PMA bit needs to exhibit PMA in both free and reference layers in order to generate tunneling magnetoresistance (TMR). Spintronic devices with perpendicular magnetic anisotropy have an advantage over MRAM devices based on in-plane anisotropy in that they can satisfy the thermal stability requirement but also have no limit of cell aspect ratio. As a result, spin valve structures based on PMA are capable of scaling for higher packing density which is one of the key challenges for future MRAM applications and other spintronic devices.

In a MTJ within a MRAM or STT-MRAM, a reference layer will usually exert a stray magnetic field upon the free layer that tends to favor either the P or AP state. The stray field (Ho) has a form similar to a non-uniform electric "fringing" field at the edges of a parallel plate capacitor. As depicted in FIG. 1, the stray field Ho 4 from reference layer 1 impinges on the free layer 3. Note that a dielectric spacer 2 such as a tunnel barrier layer separates the free layer and reference layer. When the reference layer 1 is a composite, the net stray field 4 will be the sum of fringing fields from several similar layers in the reference layer stack with the possible addition of a uniform effective "interlayer" coupling field. The free layer is subject to random thermal agitation and the stray field Ho will create a disparity in the thermal stability of the two states, with either the P or AP state rendered more thermally stable. This asymmetry is undesirable since for a given free layer coercivity (Hc), Ho should be zero for optimum stability. Generally, Ho=0 is difficult to achieve in practice, and as a rule, Ho<15% of Hc is a reasonable target in actual devices.

Referring to FIG. 2, a synthetic antiferromagnetic (SAF) structure 18 is commonly employed as a reference layer to reduce the magnitude of Ho that impinges on a free layer 17. The SAF stack consists of two ferromagnetic layers labeled AP2 11, and AP1 13 which are coupled antiferromagnetically through an intervening non-magnetic layer 12 that is typically Ru. There is a tunnel barrier layer 16 formed between the SAF structure 18 and free layer 17.

The net stray magnetic field Ho exerted by SAF structure 18 in a STT-MRAM bit with a 40 nm diameter is usually more than 500 Oe which is an unacceptably high value of about the same magnitude as the free layer Hc. Therefore, an improved reference layer is needed that generates a sufficiently small Ho to avoid disrupting the P or AP state in a free layer within the MTJ.

SUMMARY OF THE INVENTION

One objective of the present disclosure is to provide a synthetic antiferromagnetic (SAF) structure for a STT-MRAM which has PMA and a Ho field substantially less than that produced by a SAF layer with an AP2/Ru/AP1/CoFeB configuration.

A second objective of the present disclosure is to provide a SAF structure according to the first objective that may serve as a reference layer and/or a free layer in a magnetic tunnel junction (MTJ).

According to one embodiment, these objectives are achieved in a MTJ having a bottom spin valve configuration for spintronic device applications such as a read/write head, or spin-transfer oscillator devices for MRAM, or microwave assisted memory recording (MAMR). The MTJ is comprised of a stack of layers including a composite seed layer, a SAF reference layer, tunnel barrier layer, free layer, and cap layer which are sequentially formed on a substrate. The seed layer may be TaN/Mg/NiCr, for example, and is critical for enhancing the (111) texture and PMA character in overlying layers. In one aspect, the SAF reference layer has an AP2/Ru/CoFeB configuration where the AP2 layer has intrinsic PMA and is made of a laminated stack (A1/A2)n where A1 is one of Co and CoFe or an alloy thereof, and A2 is one of Pt, Pd, Rh, Ru, Ir, Mg, Mo, Os, Si V, Ni, NiCo, and NiFe where the number of laminates "n" is between 1 and 10, and preferably less than 6. Optionally, A1 is Fe and A2 is V. The overall thickness of the SAF structure is minimized by reducing the thickness of the AP2 and CoFeB layers in order to reduce Ho. Furthermore, as the number of laminates is decreased, coercivity (Hc) increases. As the CoFeB thickness decreases to less than 10 Angstroms, PMA is induced in the CoFeB layer through antiferromagnetic (AF) coupling with the laminated AP2 stack.

Alternatively, the laminated AP2 structure may be replaced by a L10 ordered alloy of the form MT wherein M is Rh, Pd, Pt, Ir, or an alloy thereof, and T is Fe, Co, Ni or alloy thereof. Furthermore, the MT alloy may be doped with B to give a boron content up to 40 atomic %. In yet another embodiment, the AP2 layer may be an amorphous rare earth-transition (RE-TM) alloy such as TbCo, TbFeCo, or GdFeCo that exhibits PMA. A tunnel barrier comprised of MgO or another metal oxide formed on a top surface of the SAF structure helps to maintain PMA character within the thin CoFeB layer. There is a free layer contacting a top surface of the tunnel barrier and a cap layer as the uppermost layer in the MTJ stack. Preferably, the free layer has PMA to enhance the TMR ratio in the MTJ.

In a second embodiment, a top spin valve structure is provided wherein a seed layer, SAF free layer, tunnel barrier, reference layer, and capping layer are sequentially formed on a substrate. The SAF free layer is comprised of a FL2/Ru/CoFeB configuration where the FL2 layer has intrinsic PMA and contacts a top surface of the seed layer. The FL2 layer is comprised of a laminated structure, a L10 alloy, or a rare earth alloy as described previously with respect to the AP2 layer in the first embodiment. The CoFeB layer is preferably less than 10 Angstroms thick and has a top surface that adjoins a tunnel barrier made of MgO or the like. The reference layer has intrinsic PMA and may be made of the same material as the AP2 layer in the first embodiment. In both embodiments, the Ru coupling layer is preferably 4 or 9 Angstroms thick to provide optimum antiferromagnetic coupling between the FL2 (or AP2) layer and the CoFeB layer. In alternative embodiments, the SAF free layer may be formed in a bottom spin valve configuration and the SAF reference layer may be employed in a top spin valve configuration. Moreover, both of the SAF reference layer and SAF free layer described herein may be combined in the same MTJ stack of layers.

In another embodiment, the antiferromagnetic coupling is enhanced by inserting a Co dusting layer along each of the top and bottom surfaces of the Ru coupling layer. Thus, the SAF structure has a stack represented by AP2/Co/Ru/Co/CoFeB for a reference layer in a bottom spin valve configuration and FL2/Co/Ru/Co/CoFeB for a free layer in a top spin valve configuration.

In all embodiments, once all of the layers in the MTJ stack are laid down, a patterning and etching sequence is followed to fabricate a spin valve structure that may be in the shape of an oval, circle, or polygon from a top-down view.

DETAILED DESCRIPTION

Figure 1:
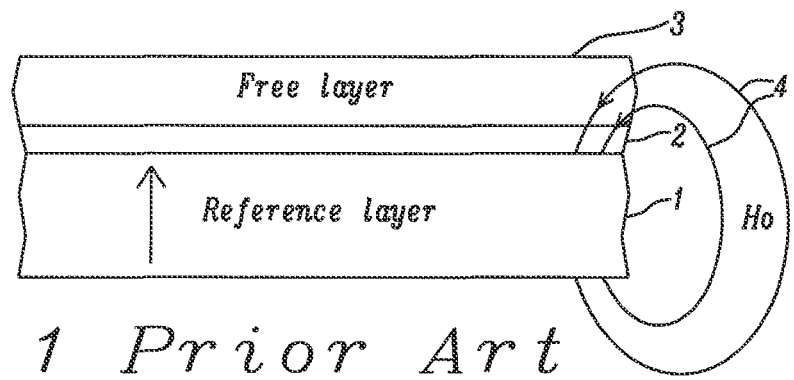
FIG. 1 is a cross-sectional view of a MTJ wherein the stray fringe field Ho from the reference layer is exerted on a free layer.
Figure 2:
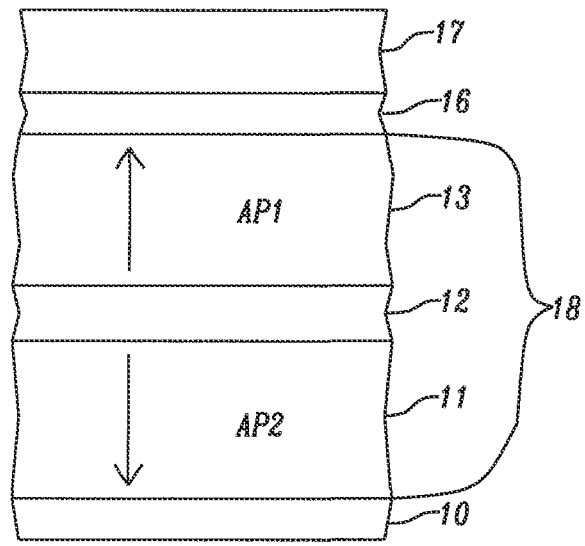
FIG. 2 is a cross-sectional view of a MTJ with a bottom spin valve configuration wherein a reference layer has a SAF structure represented by AP2/coupling layer/AP1.

The present disclosure is a SAF structure which includes a layer with intrinsic PMA that induces PMA in a thin CoFeB layer across an antiferromagnetic coupling layer for enhanced performance in spin transfer oscillators including MAMR devices, STT-MRAM devices, and in other spintronic devices. When the intrinsic PMA layer is made of a laminated stack (A1/A2)n where A1 is one of Co and CoFe or an alloy thereof, and A2 is one of Pt, Pd, Rh, Ru, Ir, Mg, Mo, Si, Os, V, Ni, NiCo, and NiFe, then A1 and A2 may be switched to give a (A2/A1)n stack providing the same advantages as the (A1/A2). arrangement. Although only bottom spin valve or top spin valve configurations are shown in the drawings, the present disclosure also encompasses dual spin valves as appreciated by those skilled in the art.

As mentioned in related U.S. Pat. No. 8,064,244, the magnetic anisotropy of a $(Co/Ni)_n$. laminated structure arises from the spin-orbit interactions of the 3d and 4s electrons of Co and Ni atoms. Such interaction causes the existence of an orbital moment which is anisotropic with respect to the crystal axes which are in (111) alignment, and also leads to an alignment of the spin moment with the orbital moment. In (Co/Ni)n laminates and the lilke as represented by (A1/A2)n, it is essential to have a fee (111) super-lattice in order to establish PMA. Previously, the inventors have employed a reference layer consisting of a single laminated stack of (Co/Ni)n as described in U.S. Pat. No. 8,064,244, or a synthetic antiferromagnetic (SAF) structure represented by AP2/Ru/AP1/CoFeB. However, the Ho field associated with both of these schemes is too high and leads to decreased thermal stability in the free layer.

Figure 3:
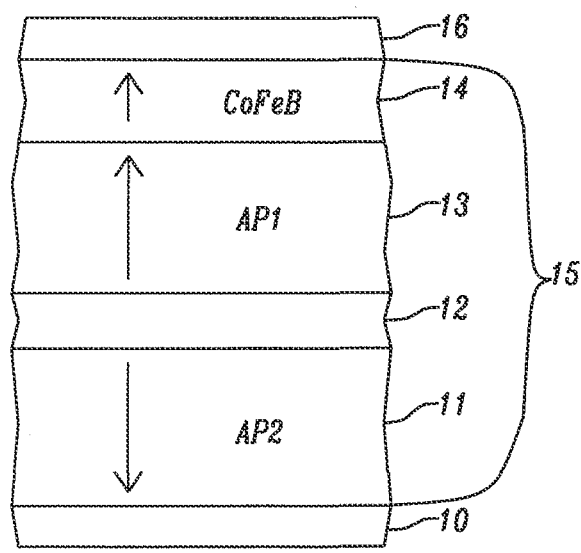
FIG. 3 is cross-sectional view of a MTJ with a bottom spin valve configuration wherein the reference layer is a composite with a AP2/Ru/AP1/CoFeB stack and the AP1 layer is ferromagnetically coupled with the CoFeB layer.

Referring to FIG. 3, the SAF reference layer 15 having intrinsic PMA and with a AP2/Ru/AP1/CoFeB configuration is further described in that AP1 and AP2 are both bulk-PMA multilayers made of (Co/Pd)n, (Co/Pt)n, (Co/Ni)n or the like where n is the number of laminates, or an L10 alloy such as FePt or FePd, or an amorphous rare earth-transition metal alloy such as TbCo. A thin CoFeB dusting layer 14 is formed adjacent to a tunnel barrier 16 and is ferromagnetically coupled to the AP1 layer. The dusting layer promotes substantially higher TMR than the AP1 layer by itself since the amorphous CoFeB crystallizes to a bee structure during post-deposition annealing thereby increasing TMR especially when adjoining a (100) MgO tunnel barrier layer. A CoFeB thickness is selected that is a compromise between a thick layer for higher TMR and a thin layer that is below the threshold level to establish PMA and provide high coercivity where SAF He>free layer He. As a result, high coercivity and PMA are provided by AP2 layer 11 and AP1 layer 13 while the thin dusting layer is responsible for good electrical properties (high TMR). AP1 layer 13 and CoFeB dusting layer 14 are ferromagnetically coupled and have a magnetization in the same direction that is perpendicular to the planes of the layers. Without the PMA influence provided by AP1 and AP2, the magnetic moment of the dusting layer would be in-plane and result in zero TMR between P and AP states.

It is also important that a SAF structure be "balanced" which means the saturation magnetization x thickness product (Mst) ratio between the layers on either side of the Ru interlayer should be approximately 1.00. In SAF reference layer 15, when AP1 is (Co/NOR), AP2 is $(Co/Ni)_6$, each of the Co layers has a 2.5 Angstrom thickness, each of the Ni layers has a 6 Angstrom thickness, and CoFeB thickness is 10 Angstroms, then (Mst AP1+Mst CoFeB)/Mst AP2=1.00. Unfortunately, the stray field Ho generated by this SAF structure is over 500 Oe which is an unacceptably high value for STT-MRAM bits.

We have surprisingly found that decreasing the thickness of the SAF structure in FIG. 3 leads to a substantial reduction in the Ho field exerted by a composite reference layer on the free layer. Meanwhile, a significant He is maintained within the reference layer and a balanced Mst ratio is achieved when the reduction of SAF structure thickness is accomplished by a combination of modifications including removal of the AP1 layer, and preferably thinning both of the AP2 layer and CoFeB layer. As a result, PMA character is conveyed to the CoFeB layer not by direct ferromagnetic coupling to the AP1 layer as in the aforementioned FIG. 3 scheme, but through antiferromagnetic coupling with the AP2 layer.

Figure 4:
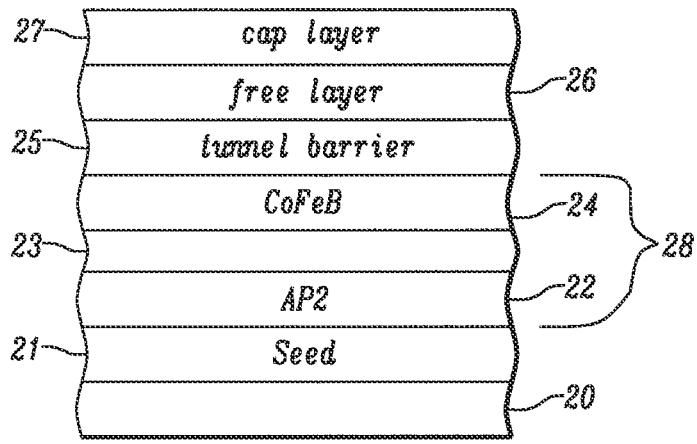
FIG. 4 is a cross-sectional view of a MTJ with a bottom spin valve configuration in which the reference layer is a composite with an AP2 layer having intrinsic PMA and AF coupled to a CoFeB layer according to an embodiment of the present disclosure.

According to one embodiment as depicted in FIG. 4, the SAF structure is employed as a composite reference layer in a bottom spin valve configuration wherein a MTJ is comprised of a seed layer 21, SAF reference layer 28, tunnel barrier layer 25, free layer 26, and cap layer 27 that are sequentially formed on a substrate 20. The substrate may be a bottom electrode in a STT-MRAM device. The seed layer 21 may be a composite such Ta/M1M2 where M1 is a metal having a fee (111) or (hep) hexagonal closed packed (001) crystal orientation such as Ru, and M2 is Cu, Ti, Pd, Pt, W, Rh, Au, or Ag. In another preferred embodiment, the seed layer may have a TaN/Mg/X, Ta/X, or Ta/Mg/X configuration wherein X is a growth enhancement layer and is one of NiCr or NiFeCr. However, other seed layer materials are acceptable that promote a (111) crystal orientation in an overlying SAF reference layer.

A key feature of the present disclosure is the SAF reference layer 28 that includes a lower AP2 (ferromagnetic) layer 22 having intrinsic PMA, a middle antiferromagnetic coupling layer 23, and an upper CoFeB layer 24. In one aspect, the AP2 layer is a (A1/A2)n laminated stack where A1 is one of Co and CoFe or an alloy thereof, and A2 is one of Pt, Pd, Rh, Ru, Ir, Mg, Mo, Os, Si, V, Ni, NiCo, and NiFe where the number of laminates "n" is between 1 and 10, and preferably less than 6 to minimize the thickness and Ho field of the SAF structure while maintaining high coercivity (He) and sufficient PMA to support PMA in the CoFeB layer 24. Each of the A1 layers has a thickness from 0.5 to 5

Angstroms, and preferably between 1.5 to 3 Angstroms. Each of the A2 layers in the laminated stack has a thickness from 2 to 10 Angstroms, and preferably between 3.5 and 8 Angstroms. Preferably, the thickness t2 of an A2 layer is greater than an A1 layer thickness t1, and more preferably, t2~2×t1 in order to optimize the spin orbit interactions between adjacent A1 and A2 layers. It should be understood that when A2 is one of Rh, Ir, Ru, Os, Mo, or an alloy thereof, and n is between 2 and 10, ferromagnetic or antiferromagnetic coupling is established between neighboring A1 layers in the (A1/A2)n laminate. In another embodiment, A1 is Fe and A2 is V.

In an alternative embodiment, the AP2 layer 22 may be a L10 ordered alloy of the form MT wherein Mis Rh, Pd, Pt, Ir, or an alloy thereof, and Tis Fe, Co, Ni or alloy thereof. Furthermore, the MT alloy may be doped with B to give a boron content up to 40 atomic %. In yet another embodiment, the AP2 layer may be a rare earth-transition metal alloy such as TbCo, TbFeCo, or GdFeCo. The antiferromagnetic coupling layer 23 is non-magnetic and preferably is one of Ru, Ir, Rh, Os, Mo, V, or an alloy thereof. When Ru is selected as the coupling layer, the thickness is preferably 4 or 9 Angstroms to provide maximum coupling strength between the AP2 layer 22 and CoFeB layer 24.

In order to induce PMA character in the CoFeB layer 24 through antiferromagnetic coupling with AP2 layer 22, and maintain the PMA throughout the device lifetime, the CoFeB layer preferably has a thickness less than about 12 Angstroms. Furthermore, the CoFeB layer thickness should be at least 6 Angstroms to promote a high TMR ratio in the MTJ. It is believed that the tunnel barrier layer also induces a certain degree of PMA in the CoFeB layer along the interface between layers 24, 25.

Figure 5:
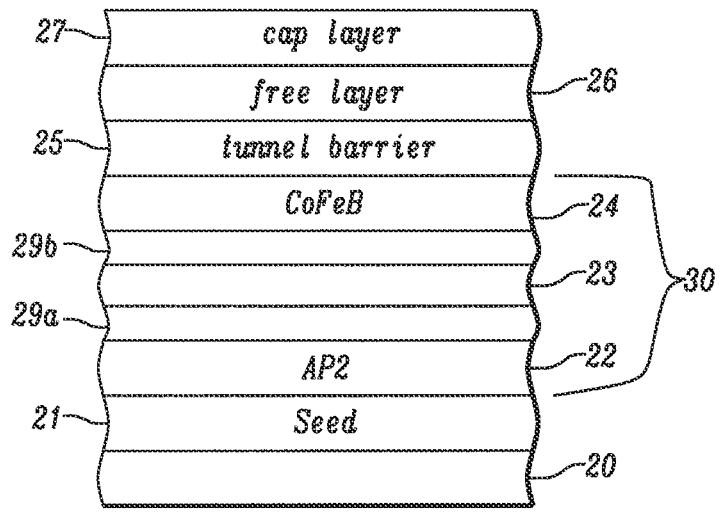
FIG. 5 is a cross-sectional view of a MTJ with a bottom spin valve configuration similar to that depicted in FIG. 3 except a Co dusting layer is inserted on either side of the Ru coupling layer according to a second embodiment of the present disclosure.

In a second embodiment illustrated in FIG. 5, antiferromagnetic coupling between AP2 layer 22 and CoFeB layer 24 may be enhanced by further including a Co dusting layer that adjoins both of the top and bottom surfaces of a Ru coupling layer, for example. A Co rich alloy with a Co content above 50 atomic % may also be used as a dusting layer. Preferably, the Co or Co alloy dusting layers 29a, 29b have a thickness from about 2 to 10 Angstroms, and more preferably about 4 Angstroms. A first Co dusting layer 29a contacts a top surface of AP2 layer 22 and a bottom surface of the coupling layer 23. A second Co dusting layer 29b contacts a top surface of the coupling layer 23 and a bottom surface of the CoFeB layer 24. In this embodiment, the combined thickness of second dusting layer 29b and CoFeB layer 24 is preferably from 7 to 15 Angstroms.

The tunnel barrier layer 25 is comprised of MgO or another metal oxide such as AlOx, TiOx, and ZnOx. A MgO tunnel barrier layer may be fabricated by depositing a first Mg layer on the CoFeB layer 24, and then performing a natural oxidation (NOX) or radical oxidation (ROX) process, and finally depositing a second Mg layer on the oxidized first Mg layer. During a subsequent annealing process, the second Mg layer is oxidized to afford a substantially uniform MgO layer. Typically for STT-MRAM, a ROX process is preferred for tunnel barrier formation in order to produce a relatively high resistance x area (RA) value of up to 1000 ohm-um$^2$ or more. However, the present disclosure anticipates that a NOX method may be used to make the tunnel barrier layer 25.

The free layer 26 may be a thin CoFeB layer wherein PMA is induced through an interface with the tunnel barrier layer. Furthermore, a PMA enhancing layer such as MgO or another metal oxide may be inserted between the free layer 26 and cap layer 27 to further induce PMA in the free layer through a second interface. In another embodiment, a material with intrinsic PMA such as a laminated (A1/A2)n stack, L10 alloy, or RE-TM alloy described with respect to AP2 layer 22 may be employed as the free layer. The present disclosure also anticipates the free layer 26 may have a SAF structure represented by CoFeB/Co/Ru/Co/FL2 in a bottom spin valve configuration where FL2 is (A1/A2)n, the Co layers adjoining the Ru AF coupling layer enhance the AF coupling between FL2 and CoFeB, and the CoFeB portion of the free layer contacts a top surface of the tunnel barrier layer. In the aforementioned SAF free layer structure, the combined thickness of CoFeB and adjoining Co dusting layer is from 7 to 15 Angstroms.

Preferably, the cap layer 27 is a material that provides good electrical contact with an overlying top electrode (not shown), and getters oxygen from the free layer to improve the TMR ratio. Examples of cap layers are Ru/Ta, Ta/Ru, and Ru/Ta/Ru, although other cap layer materials used in the industry may be selected for the MTJ of the present disclosure. In an embodiment wherein both of the reference layer and free layer have a SAF structure as described above, the cap layer may be NiCr/Ru or Ni/Ta to support PMA in the FL2 layer that contacts the cap layer. Thus, the present disclosure encompasses a MTJ stack represented by TaN/Mg/NiCr/AP2/Co/Ru/Co/CoFeB/MgO/CoFeB/Co/Ru/Co/FL2/NiCr/Ru where TaN/Mg/NiCr is a seed layer for the SAF reference structure and NiCr/Ru is a cap layer on the SAF free layer structure.

Figure 6:
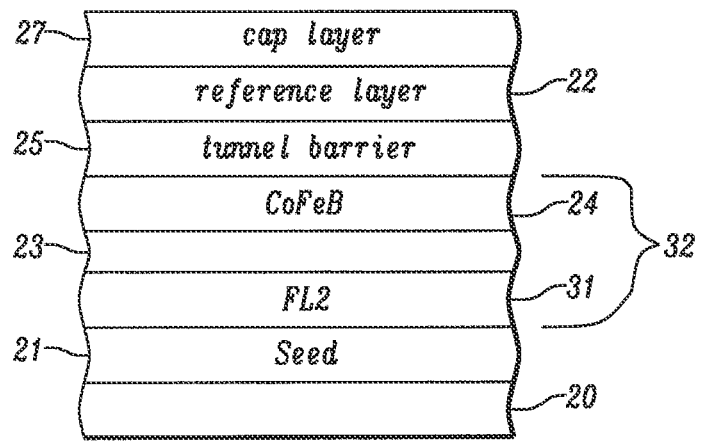
FIG. 6 is a cross-sectional view of a MTJ with a top spin valve configuration wherein a FL2 free layer with intrinsic PMA is antiferromagnetically coupled to a CoFeB layer according to a second embodiment of the present disclosure.

In FIG. 6, a third embodiment of the present disclosure is described wherein the SAF structure previously described is used as a free layer in a MTJ with a top spin valve configuration. All of the layers are retained from FIG. 4 except for free layer 26 which is now SAF free layer 32 that is comprised of a lower FL2 (ferromagnetic) layer 31 having intrinsic PMA and contacting a top surface of seed layer 21, a middle antiferromagnetic coupling layer 23, and upper CoFeB layer 24. In other words, seed layer 21, SAF free layer 32, tunnel barrier 25, reference layer 22, and capping layer 27 are sequentially formed on substrate 20. Reference layer 22 has intrinsic PMA and is comprised of an (A1/A2)n laminated stack, an L10 alloy, or a RE-TM alloy as described earlier. Likewise, FL2 layer 31 has intrinsic PMA and is preferably selected from an (A1/A2)n laminated stack, an L10 alloy, or a RE-TM alloy as described previously. The present disclosure also anticipates that reference layer 22 with intrinsic PMA may be replaced by a reference layer comprised of a thin CoFeB layer from 6 to 15 Angstroms thick wherein PMA is induced in the CoFeB layer through an interface with the tunnel barrier layer 25.

There are multiple advantages of a free layer having a SAF structure according to the third embodiment wherein PMA is induced in a CoFeB layer through antiferromagnetic coupling with an intrinsic PMA layer. First, the effect of stray fringing fields (Ho) from the reference layer is minimized. In addition, the CoFeB layer 24 with PMA enables a high TMR ratio with high thermal stability. Furthermore, the free layer maintains high intrinsic and adjustable coercivity.

Figure 7:
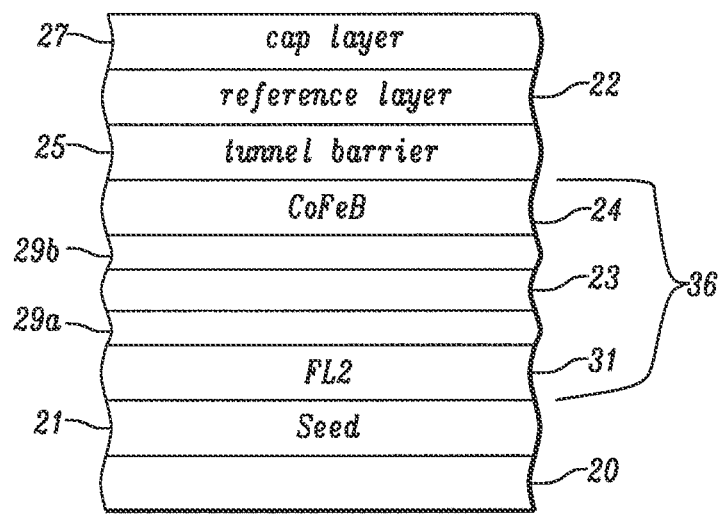
FIG. 7 is a cross-sectional view of a MTJ with a bottom spin valve configuration wherein the free layer has a SAF structure with a CoFeB layer contacting a top surface of the tunnel barrier layer.

Referring to FIG. 7, the present disclosure also anticipates an embodiment wherein the SAF free layer structure in FIG. 6 is further comprised of a first Co dusting layer 29a formed between FL2 layer 31 and the coupling layer 23, and a second Co dusting layer 29b inserted between the coupling layer 23 and CoFeB layer 24 to strengthen the antiferromagnetic coupling between the FL2 layer and CoFeB layer. The modified SAF free layer structure 36 contacts a top surface of seed layer 21. According to one embodiment, tunnel barrier layer 25, reference layer 22, and cap layer 27 are formed in consecutive order on CoFeB layer 24. However, one skilled in the art will appreciate that reference layer 22 may be substituted with a SAF reference layer structure wherein a CoFeB layer, an antiferromagnetic coupling layer, and a reference layer with intrinsic PMA are sequentially formed on the tunnel barrier layer.

Figure 8:
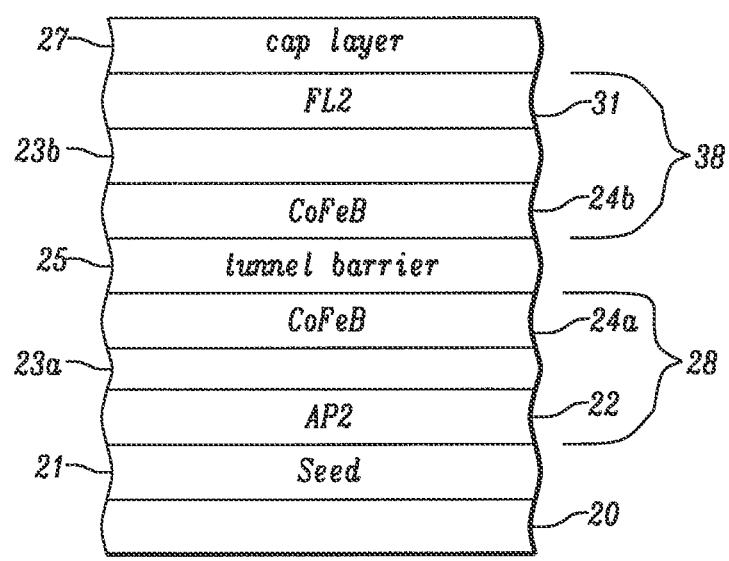
FIG. 8 is a cross-sectional view of a MTJ with a top spin valve configuration wherein the reference layer has a SAF structure with a CoFeB layer contacting a top surface of the tunnel barrier layer.

Referring to FIG. 8, the present disclosure also encompasses an embodiment wherein the MTJ has a bottom spin valve configuration and both of the reference layer and free layer have a SAF structure. In the exemplary embodiment, a MTJ is shown wherein a seed layer 21, SAF reference layer 28, and tunnel barrier 25 are sequentially formed on a substrate as in the first embodiment. The SAF reference layer has a lower AP2 layer with intrinsic PMA, a middle antiferromagnetic coupling layer 23*a*, and an upper CoFeB layer 24*a*. In this case, a SAF free layer 38 consisting of a lower CoFeB layer 24*b*, middle antiferromagnetic coupling layer 23*b*, and FL2 layer 31 with intrinsic PMA is formed on a top surface of the tunnel barrier. The uppermost layer in the MTJ is a cap layer that contacts a top surface of FL2 layer 31. Layers 23*a*, 23*b* have the same thickness and properties as previously described for antiferromagnetic coupling layer 23. CoFeB layers 24*a*, 24*b* preferably have a thickness between 6 and 12 Angstroms such that PMA may be induced and maintained within the CoFeB layers through antiferromagnetic coupling with the AP2 and FL2 layers, respectively, and in part through the interface with the tunnel barrier layer 25.

Figure 9:
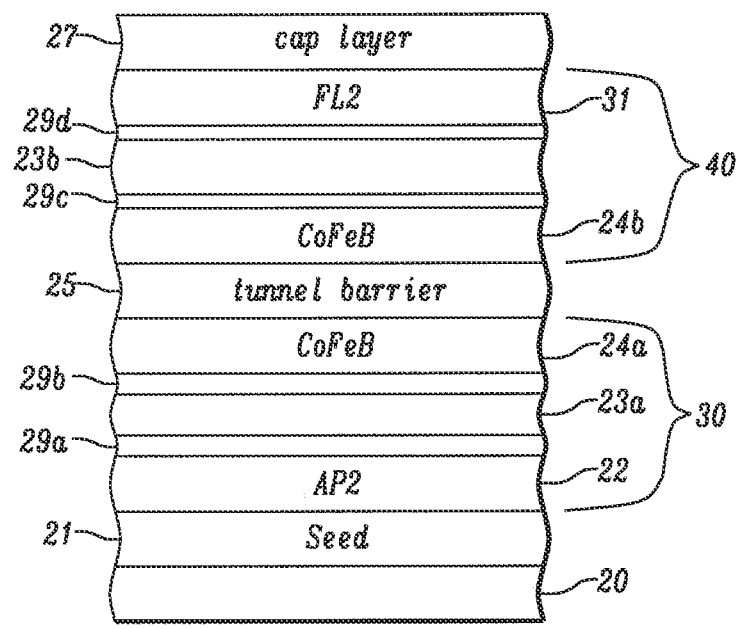
FIG. 9 is a cross-sectional view of a MTJ with a bottom spin valve configuration that employs both of a SAF free layer and SAF reference layer structure wherein both SAF structures contain Co dusting layers according to an embodiment of the present disclosure.

In an alternative embodiment depicted in FIG. 9 where a first Co dusting layer 29*a* is inserted between layers 23*a* and 24*a*, and a second Co dusting layer 29*b* is inserted between layers 23*b* and 24*b*, then the combined thickness of first Co dusting layer and CoFeB layer 24*a* is from 7 to 15 Angstroms. Likewise, the combined thickness of the second Co dusting layer and CoFeB layer 24*b* is preferably between 7 and 15 Angstroms. Moreover, there may be a third Co dusting layer 29*c* between AP2 layer 22 and coupling layer 23*a*, and a fourth Co dusting layer 29*d* between FL2 layer 31 and coupling layer 24*b*. Thus, this embodiment features a SAF free layer structure 40 and a SAF reference layer structure 30 both having Co dusting layers adjoining AF coupling layers 23*a*, 23*b*.

Figure 10:
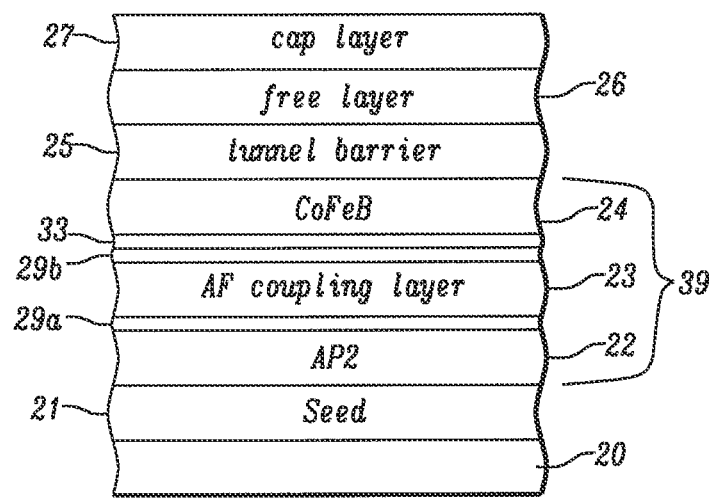
FIG. 10 is modification of the MTJ in FIG. 5 where an insertion layer is formed between the AF coupling layer and CoFeB layer in an SAF structure.

Referring to FIG. 10, another embodiment is depicted wherein the SAF structure 30 in FIG. 5 is modified to form SAF structure 39 that includes a non-magnetic insertion layer 33 made of Ta, Al, Cu, Zr, Hf, Nb, Mg, or Mo formed between the dusting layer 29*b* and CoFeB layer 24. The insertion layer serves as a moment dilution layer and has a thickness from 0.5 to 10 Angstroms, and preferably between 1 and 5 Angstroms.

Note that in all of the aforementioned embodiments, the CoFeB layer in the SAF structure contacts the tunnel barrier layer. In other words, when a SAF free layer or SAF reference layer structure is formed between the substrate and tunnel barrier, the CoFeB layer is the uppermost layer in the SAF stack. However, when the SAF structure is formed between the tunnel barrier and cap layer, then the CoFeB layer is below the antiferromagnetic coupling layer and AP2 (or FL2) layer and is the bottom layer in the SAF stack.

After all layers in the full field MTJ stack are laid down, the stack may be processed as deposited or may be annealed at temperatures between 200° C. and 500° C. in embodiments where Co or Co alloy dusting layers are included to enhance AF coupling between the AP2 (or FL2) layer and CoFeB layer in one or both of a SAF reference layer structure and SAF free layer structure. For embodiments where Co or Co alloy dusting layers are omitted, the upper limit for annealing temperature is preferably 350° C.

EXAMPLE 1

To further describe the effect of AP2 layer thickness on SAF reference layer properties with regard to the second embodiment that has an AP2/Co/Ru/Co/CoFeB configuration, a MTJ stack was fabricated with the following bottom spin valve configuration where the number following the layer indicates the layer thickness: TaN20/Mg7/NiCr5O/(Co2.5/Ni6)$_{10}$/Co4/Ru4/Co4/Co20Fe508 201 0/Mg0(8/4ROX)/Co20Fe$_{60}$8$_{20}$3/Ta20/Ru50. In this case, TaN/Mg/NiCr is the seed layer and Ta/Ru serves as a cap layer. The MgO tunnel barrier is made by first depositing an 8 Angstrom thick Mg layer, followed by an ROX process, and then depositing a second Mg layer that is 4 Angstroms thick. Ho is measured to be −190 Oe and the Mst balance ratio=0.40. If the number of laminates "n" in the (CoNi)n AP2 stack is reduced from 10 to 6, then Ho=0 and the balance ratio=0.66. When n is lowered to 4, then Ho=125 Oe and the balance ratio=0.99.

Figure 11:
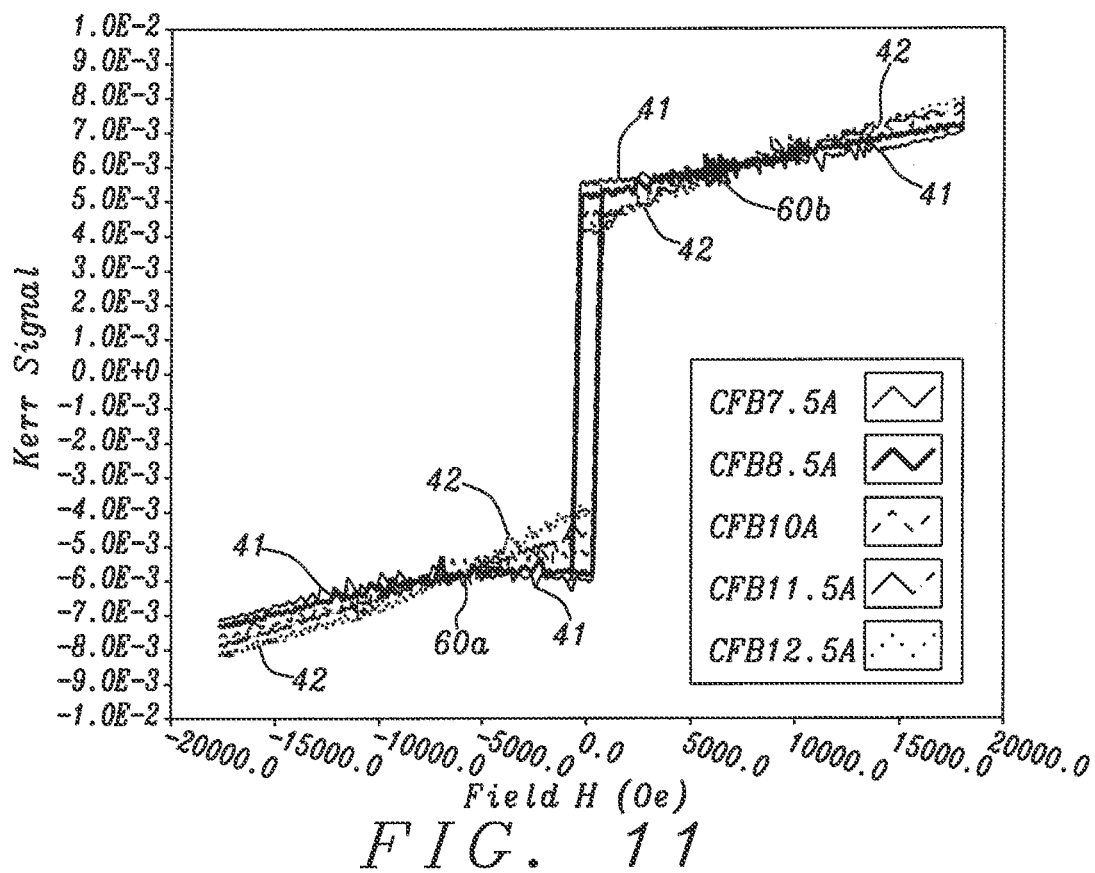
FIG. 11 is a plot of Kerr signal as a function of applied field for a reference layer stack made of $(Co/Ni)_{10}$/Ru/CoFeB and with various thickness for the CoFeB layer.

Referring to FIG. 11, the viability of a SAF reference layer according to the second embodiment wherein the SAF reference layer has an AP2/Co/Ru/Co/CoFeB configuration is demonstrated by measuring the polar Kerr signal which is approximately proportional to the perpendicular component of magnetization. The horizontal axis on the plot is the field (H) that is applied perpendicular to the plane of the layers at a magnitude ranging from −18000 Oe to +18000 Oe. Note that in all of the samples where CoFeB thickness varies from 7.5 Angstroms (curve 41) to 12.5 Angstroms (curve 42), the Kerr signal changes sign abruptly for H=−500 Oe. At this field, the AP1 (CoFeB) magnetization flips over. For the CoFeB dusting layer to be perpendicularly magnetized, its thickness must be less than a threshold value, which in this case is around 10 Angstroms. When the CoFeB thickness in the SAF structure is <10 Angstroms, the CoFeB layer has PMA and switches with the AP2 layer. After switching, the magnetization (PMA) is constant up to the spin flop transition field of about 5000 Oe (point 60*a* or 60*b*) where the antiferromagnetic field coupling between the AP2 and CoFeB layers is overcome. For a CoFeB layer thickness >10 Angstroms, the PMA imparted from the AP2 layer through the Ru coupling layer is not strong enough to sustain perpendicular magnetization in the CoFeB layer. The absence of PMA in the thicker CoFeB layers is indicated by the steady increase of the Kerr signal due to the CoFeB layer when H>0 and the absence of spin flopping at higher fields.

Figure 12:
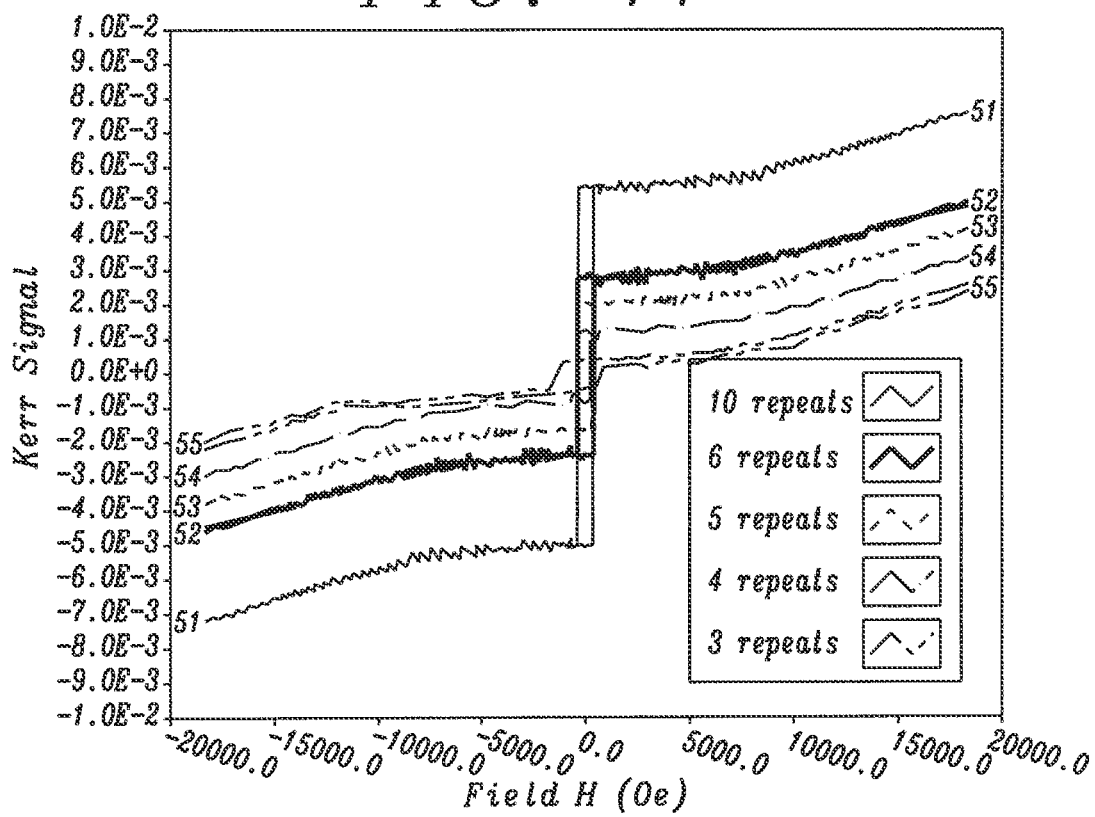
FIG. 12 is a plot of Kerr signal as a function of applied field for a reference layer stack made of (Co/Ni)n/Ru/CoFeB wherein the number of laminates is varied while keeping a constant CoFeB thickness.

Referring to FIG. 12, a similar MTJ stack to that described with regard to Example 1 was fabricated wherein the number of the laminates "n" in the (Co2.5/Ni6)n layer is varied from 3 to 10, and the Co$_{20}$Fe$_{60}$8$_{20}$ layer thickness is kept at 7.5 Angstroms. Thus, the MTJ in this study has a bottom spin valve configuration represented by TaN20Mg7/NiCr5O/Cp2.5/Mi6/Co20Fe50820 7.5MgO(8/4ROX)/Co20Fe508203/Ta20/Ru50 wherein both of the (Co/Ni)n AP2 layer and CoFeB layer in the SAF reference layer have PMA. Once again, a plot of Kerr signal vs. applied field (H) is illustrated. As the number of laminates "n" decreases from 10 to 3, the Kerr signal diminishes and SAF coercivity (He) increases. The increase in He from 500 Oe for n=10 to 1000 Oe for n=3 is because the Mst balance ratio for a "n" value of 3 or 4 is approximately 1.00. An important finding is that SAF He is retained and even increased as the AP2 layer becomes thinner. As a result, the requirement that SAF He>free layer He is satisfied in this embodiment. Moreover, we have found there is design latitude in terms of AP2 thickness and CoFeB thickness when fabricating a SAF structure for minimal fringing field Ho.

Figure 13B:
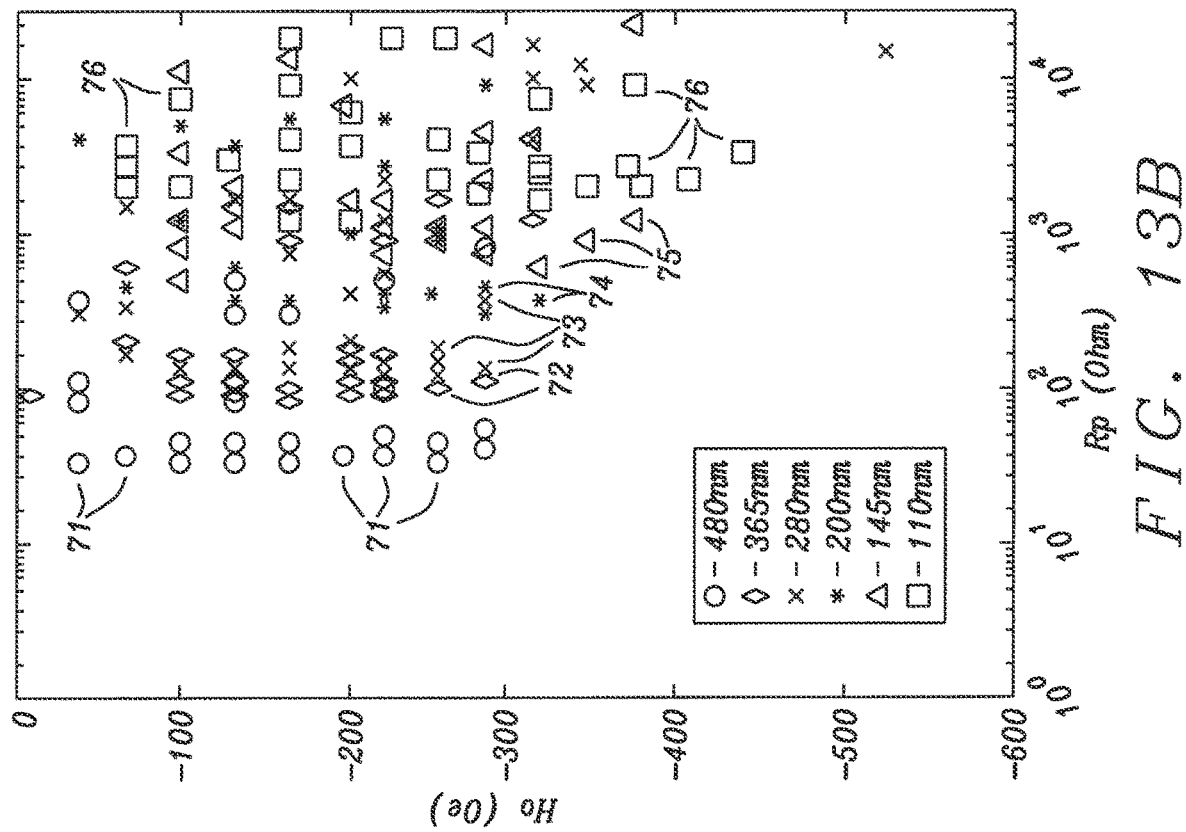
FIGS. 13A, 13B are plots that show change in loop shift with junction resistance for a prior art MTJ and a MTJ having a SAF reference layer formed according to an embodiment of the present disclosure.
Figure 13A:
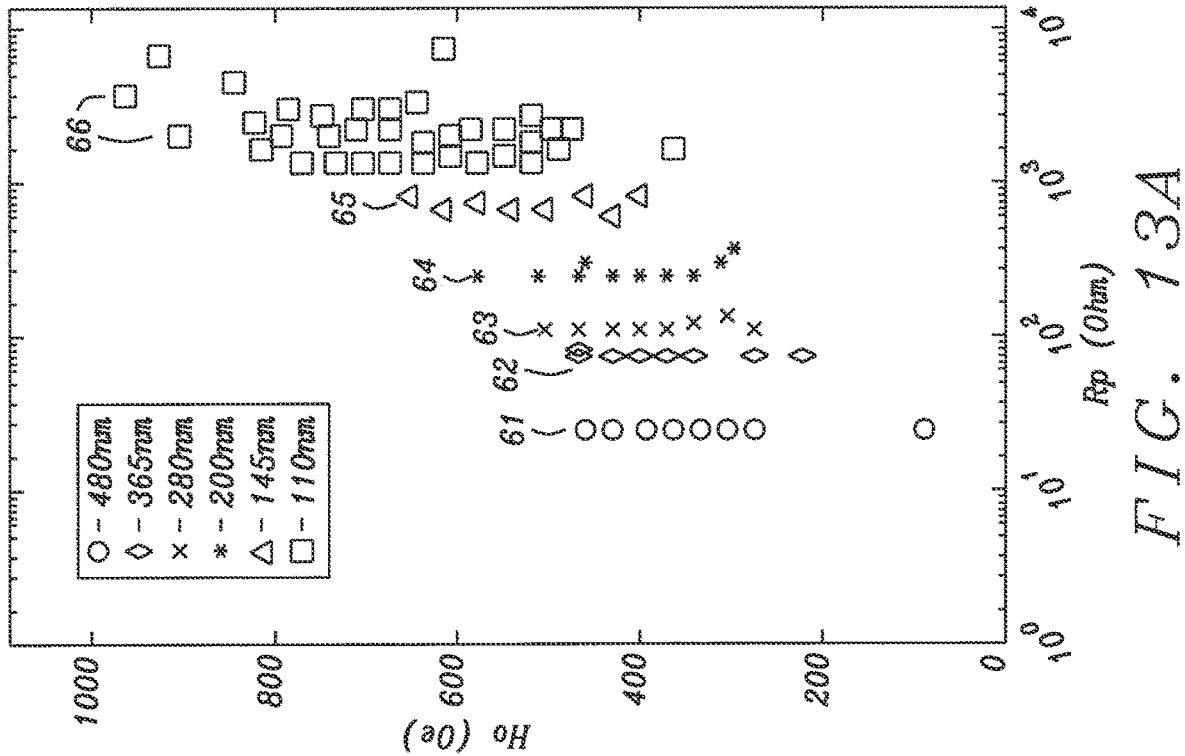

Referring to FIG. 13A, a plot is provided that shows change in loop shift as a function of junction resistance for a MTJ previously fabricated by the inventors that has a NiCr/(Co/Ni)10/Co4/Ru4/Co4/(Co/Ni)5/Ta1.5/CoFeB6/Co4/MgO/CoFeB12/Ta configuration where NiCr is a seed layer, a 1.5 Angstrom thick Ta layer is inserted between the (Co/Ni)10/Co/Ru/Co/(Co/Ni)5 reference layer and CoFeB/Co transition layer, MgO is a tunnel barrier layer, CoFeB is the free layer, and the uppermost Ta layer is a cap layer. Note there is a higher resistance (Rp) as the physical size of the patterned MTJ becomes smaller. Thus, the devices in column 61 have a nominal size of 480 nm while the devices in columns 62-66 have a nominal size of 365 nm, 280 nm, 200 nm, 145 nm, and 110 nm, respectively. It should be understood that the actual physical size of each device after the fabrication step is typically 10 to 30 nm smaller than the corresponding nominal size due to shrinkage of features as a result of reactive ion etching, for example. Each data point represents one device and the measurement is taken across the wafer. To obtain the loop shift, resistance is measured as a function of applied field. The resulting curve (not shown) is a hysteretic loop as a function of field and the reported loop shift Ho is the field corresponding to the hysteretic loop center.

Referring to FIG. 13B, a similar plot to that of the reference in FIG. 13A is shown except the MTJ is formed according to an embodiment of the present disclosure. In this example, the MTJ has a NiCr/(Co/Ni)4/Co4/Ru4/Co4/Ta1.5/CoFe86/MgO/CoFe812/Ta configuration that is fabricated according to an embodiment corresponding to FIG. 10. The composite reference layer has (Co/Ni)4 as the AP2 layer, two Co dusting layers, a Ru antiferromagnetic coupling layer, a 1.5 Angstrom thick Ta insertion layer, and an upper CoFe8 layer in the SAF structure. Each device size has a Ho value substantially less than the result in FIG. 13A and demonstrates the effectiveness of the SAF structure of the present disclosure in meeting the objective of a lower Ho value. For example, data points 71 (FIG. 13B) corresponding to the largest nominal device size of 480 nm are at lower Ho values than data points 61 for the same device size in FIG. 13A. Likewise, data points 76 corresponding to the smallest nominal device size of 110 nm are at lower Ho values than data points 66 for the same device size in FIG. 13A. Again, physical size is about 10 to 30 nm smaller for each device represented in the FIG. 13B data plot. In addition to reduced Ho values at each feature size in FIG. 13B, coercivity in the (Co/Ni)4 AP2 layer is increased compared with the thicker (Co/Ni$_{10}$ AP2 layer in the reference sample in FIG. 13A.

In the exemplary embodiments, the CoFeB composition in the SAF structure has been set at Co20Fe60B20. It should be understood that as the Fe content is increased to Co$_{10}$Fe$_{70}$B$_{20}$, for example, the Mst contribution from the CoFeB layer will increase for a given thickness. Furthermore, He and Ho will increase as the Fe content becomes larger. On the other hand, as B content becomes greater by replacing a Co20Fe60B20 layer with a Co20Fes0B30 layer, for example, the Mst contribution from the CoFeB layer will decrease, and He and Ho will decrease as well. Therefore, additional flexibility in adjusting Ho is realized by modifying the CoFeB composition in the SAF structure. Preferably, the Fe content in the CoFeB layer is greater than 20 atomic % and the B content is from 10 to 40 atomic %.

With regard to a process of forming the various spin valve configurations of the aforementioned embodiments, all of the layers in the MTJ stacks may be laid down in a sputter deposition system. For instance, a MTJ stack of layers may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas with ultra-high vacuum and the targets are made of metal or alloys to be deposited on a substrate. All of the CPP layers may be formed after a single pump down of the sputter system to enhance throughput.

As mentioned earlier, the MTJ stacks may be annealed by applying a temperature from 200° c. up to 350° c. or in the preferred embodiments up to 500° C. for a period of 5 minutes to 10 hours. No applied magnetic field is necessary during the annealing step because PMA is established due to the (111) texture in the composite seed layer 21 and due to the Co—Ni (or A1-A2) spin orbital interactions in the laminated reference layer 22 or laminated FL2 free layer 31. Thereafter, a conventional photoresist patterning and etching sequence may be performed to fabricate the MTJ stack of layers into a plurality of islands (nanopillars) having a circular, elliptical, or rectangular shape from a top-down view. Next, an insulation layer (not shown) may be deposited on the substrate 20 followed by a planarization process to make the insulation layer coplanar with the cap layer 27 on each MTJ nanopillar. Finally, a top electrode (not shown) may be formed on the cap layer as appreciated by those skilled in the art. While this disclosure has been particularly shown and described with reference to, the preferred embodiment thereof, it will be understood by those skilled in the art that various changes in form and details may be made without departing from the spirit and scope of this disclosure.

What is claimed is:

1. A method comprising:
   providing a seed layer on a substrate;
   depositing a ferromagnetic layer having intrinsic perpendicular magnetic anisotropy on the seed layer;
   depositing an antiferromagnetic coupling layer on a top surface of the ferromagnetic layer; and
   depositing a CoFeB layer on a top surface of the antiferromagnetic coupling layer wherein perpendicular magnetic anisotropy is induced in the CoFeB layer through antiferromagnetic coupling with the ferromagnetic layer.

2. The method of claim 1, wherein the seed layer is TaN/Mg/X, Ta/X, or Ta/Mg/X where X is NiCr or NiFeCr, or the seed layer has a Ta/M1/M2 composition where M1 is Ru, and M2 is one of Cu, Ti, Pd, Pt, W, Rh, Au, or Ag.

3. The method of claim 1, wherein the ferromagnetic layer is an AP2 reference layer comprised of an (A1/A2)n laminate where the lamination number "n" is less than 6, A1 is one of Co, CoFe, or an alloy thereof, and A2 is one of Pt, Pd, Rh, Ru, Ir, Mg, Mo, Os, Si, V, Ni, NiCo, and NiFe, or A1 is Fe and A2 is V, or the AP2 reference layer is made of a L10 ordered alloy of the form MT wherein M is Rh, Pd, Pt, Ir, or an alloy thereof, and T is Fe, Co, Ni or alloy thereof, or the AP2 reference layer is made of a rare earth-transition metal alloy that is TbCo, TbFeCo, or GdFeCo.

4. The method of claim 1, wherein the ferromagnetic layer is a FL2 free layer comprised of an (A1/A2)n laminate where the lamination number "n" is less than 6, A1 is one of Co, CoFe, or an alloy thereof, and A2 is one of Pt, Pd, Rh, Ru, Ir, Mg, Mo, Os, Si, V, Ni, NiCo, and NiFe, or A1 is Fe and A2 is V, or the AP2 reference layer is made of a L10 ordered alloy of the form MT wherein M is Rh, Pd, Pt, Ir, or an alloy thereof, and T is Fe, Co, Ni or alloy thereof, or the AP2 reference layer is made of a rare earth-transition metal alloy that is TbCo, TbFeCo, or GdFeCo.

5. The method of claim 1, wherein the CoFeB layer has a thickness from about 6 to 12 Angstroms.

6. The method of claim 1, further comprising:
    forming a first Co or Co alloy dusting layer between the ferromagnetic layer and antiferromagnetic coupling layer; and
    forming a second Co or Co alloy dusting layer between the antiferromagnetic coupling layer and CoFeB layer to improve the antiferromagnetic coupling between the ferromagnetic layer and CoFeB layer.

7. The method of claim 1, further comprising sequentially forming a tunnel barrier layer made of a metal oxide, a free layer with PMA, and a cap layer on a top surface of the CoFeB layer to form a MTJ stack of layers, the tunnel barrier induces additional PMA in the CoFeB layer.

8. The method of claim 7, further comprising annealing the MTJ stack with a temperature between about 200° C. and 500° C. for a period of about 5 minutes to 10 hours.

9. A method comprising:
    forming a seed layer on a substrate, the seed layer including Ta, Mg, Ni and Cr;
    forming a ferromagnetic layer having intrinsic perpendicular magnetic anisotropy on the seed layer;
    forming a first dusting layer on the ferromagnetic layer;
    forming an antiferromagnetic coupling layer on the dusting layer; and
    forming a CoFeB layer on the antiferromagnetic coupling layer.

10. The method of claim 9, wherein the ferromagnetic layer is an $(A1/A2)_n$ laminate where n is an integer less than 6, A1 is one of Co, CoFe, or an alloy thereof, and A2 is one of Pt, Pd, Rh, Ru, Jr, Mg, Mo, Os, Si, V, Ni, NiCo, and NiFe, or A1 is Fe and A2 is V.

11. The method of claim 9, wherein the ferromagnetic layer is a L10 ordered alloy of the form MT wherein M is Rh, Pd, Pt, Jr, or an alloy thereof, and T is Fe, Co, Ni or alloy thereof, or the FL2 layer is made of a rare earth-transition metal alloy that is TbCo, TbFeCo, or GdFeCo.

12. The method of claim 9, wherein the ferromagnetic layer is a $(A1/A2)_n$ laminate where n is a lamination number, A1 is one of Co, CoFe, or an alloy thereof, A2 is one of Rh, Ir, Ru, Os, Mo, or an alloy thereof and A2 provides ferromagnetic or antiferromagnetic coupling between neighboring A1 layers when n is between 2 and 10.

13. The method of claim 9, wherein the ferromagnetic layer is a reference layer.

14. The method of claim 9, wherein the ferromagnetic layer is a free layer.

15. The method of claim 9, further comprising forming a second dusting layer on the antiferromagnetic coupling layer such that the second dusting layer is disposed between the antiferromagnetic coupling layer and the CoFeB layer, and wherein the first and second dusting layers include either Co or Co alloys.

16. A method comprising:
    forming a seed layer on a substrate;
    forming a first ferromagnetic layer having intrinsic perpendicular magnetic anisotropy on the seed layer;
    forming a first antiferromagnetic coupling layer on the first ferromagnetic layer;
    forming a first CoFeB layer on the antiferromagnetic coupling layer;
    forming a tunnel barrier layer on the first CoFeB layer;
    forming a second CoFeB layer on the tunnel barrier layer;
    forming a second antiferromagnetic coupling layer on the second CoFeB layer; and
    forming a second ferromagnetic layer having intrinsic perpendicular magnetic anisotropy on the second antiferromagnetic coupling layer.

17. The method of claim 16, wherein the seed layer includes Ta, Mg, Ni and Cr.

18. The method of claim 16, wherein the forming of the tunnel barrier layer includes:
    forming a first Mg layer on the first CoFeB layer;
    oxidizing the Mg layer via an oxidation process selected from the group consisting of natural oxidation and radical oxidation;
    forming a second Mg layer on the oxidized first Mg layer; and
    annealing the second Mg layer to form the tunnel barrier layer.

19. The method of claim 16, further comprising:
    forming a first dusting layer on the first ferromagnetic layer;
    forming a second dusting layer on the first antiferromagnetic coupling layer;
    forming a third dusting layer on the second CoFeB layer; and
    forming a fourth dusting layer on the second antiferromagnetic coupling layer.

20. The method of claim 16, further comprising forming a capping layer directly on the second ferromagnetic layer, and
    wherein one of the first and second antiferromagnetic coupling layer is formed of a material selected from the group consisting of Ru, 1r, Rh, Os, Mo, V and an alloy thereof.

* * * * *